(12) United States Patent
Oshima et al.

(10) Patent No.: US 11,568,332 B2
(45) Date of Patent: Jan. 31, 2023

(54) INFORMATION PROVIDING DEVICE, INFORMATION PROVIDING METHOD, AND TRANSPORTABLE POWER SUPPLY DEVICE (71) Applicant: HONDA MOTOR CO., LTD., Tokyo (JP)

(72) Inventors: Ryo Oshima, Wako (JP); Nobuyuki Sasaki, Wako (JP); Mitsuhiro Ito, Wako (JP); Mio Oshima, Wako (JP); Yoshihiro Matsunaga, Wako (JP); Sho Takada, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/014,866

(22) Filed: Sep. 8, 2020

(65) Prior Publication Data

US 2020/0402086 A1 Dec. 24, 2020

Related U.S. Application Data

(63) Continuation of application No. PCT/JP2018/044019, filed on Nov. 29, 2018.

(30) Foreign Application Priority Data

Mar. 20, 2018 (JP) .............................. JP2018-052596

(51) Int. Cl.
*G06Q 10/06* (2012.01)
*G01R 19/00* (2006.01)
(Continued)

(52) U.S. Cl.
CPC ............. *G06Q 10/06* (2013.01); *G01R 19/00* (2013.01); *G01S 19/01* (2013.01); *G06Q 50/06* (2013.01);
(Continued)

(58) Field of Classification Search
CPC .... G06Q 30/0205; G06Q 10/10; G06Q 50/06; G06Q 50/00; G01R 19/00; G01S 19/01
See application file for complete search history.

(56) References Cited

U.S. PATENT DOCUMENTS 10,416,202 B1 * 9/2019 Contario ............... G01R 19/145
2008/0084332 A1 * 4/2008 Ritter ................... G07C 5/008
340/989
(Continued)

FOREIGN PATENT DOCUMENTS

JP 2002304487 A 10/2002
JP 2003178120 A 6/2003
(Continued)

OTHER PUBLICATIONS

"Anker Launches External Battery Line Featuring PowerIQ Technology at CES." Wireless News (2014): NA. Close-Up Media, Inc. (Year: 2014).*
(Continued)

*Primary Examiner* — William S Brockington, III
(74) *Attorney, Agent, or Firm* — Thomas | Horstemeyer, LLP (57) ABSTRACT

An information providing device includes: a reception unit configured to receive current location information on a transportable power supply device from the transportable power supply device that supplies power to an electric apparatus detachably connected thereto; an information generation unit configured to generate use place information indicating a place of use of the transportable power supply device based on the received current location information; and a transmission unit configured to transmit the use place information to a service provider's terminal. The reception unit receives information on the electric apparatus connected to the transportable power supply device from the transportable power supply device. The use place information includes information on a type of the electric apparatus connected to the transportable power supply device.

3 Claims, 12 Drawing Sheets

(51) Int. Cl.
*G01S 19/01* (2010.01)
*G06Q 50/06* (2012.01)
*G06Q 10/10* (2012.01)
*G06Q 30/02* (2012.01)

(52) U.S. Cl.
CPC ......... *G06Q 10/10* (2013.01); *G06Q 30/0205* (2013.01)

(56) References Cited

U.S. PATENT DOCUMENTS

| | | | | |
|---|---|---|---|---|
| 2011/0078074 | A1* | 3/2011 | Lipman | G06Q 20/10 705/347 |
| 2015/0204758 | A1* | 7/2015 | Schnell | G06Q 10/0631 73/114.13 |
| 2015/0364017 | A1* | 12/2015 | Hall | G06Q 20/308 340/539.13 |
| 2016/0148099 | A1* | 5/2016 | Micali | G06N 5/04 706/11 |
| 2017/0074076 | A1* | 3/2017 | Joseph | G06Q 10/06312 |
| 2018/0321356 | A1* | 11/2018 | Kulkarni | G01S 5/14 |

FOREIGN PATENT DOCUMENTS

| | | | | |
|---|---|---|---|---|
| JP | 2013247854 A | | 12/2013 | |
| WO | WO-0042690 A1 | * | 7/2000 | ............ H02J 7/0014 |
| WO | WO-2012037249 A1 | * | 3/2012 | ........ H02J 13/00028 |
| WO | 2019181074 A1 | | 9/2019 | |

OTHER PUBLICATIONS

International Search Report for PCT/JP2018/044019 dated Mar. 5, 2019.

* cited by examiner

INFORMATION PROVIDING DEVICE, INFORMATION PROVIDING METHOD, AND TRANSPORTABLE POWER SUPPLY DEVICE

CROSS-REFERENCE TO RELATED APPLICATION(S)

This application is a Continuation of International Patent Application No. PCT/JP2018/044019, filed Nov. 29, 2018, which claims the benefit of Japanese Patent Application No. 2018-052596, filed Mar. 20, 2018, both of which are hereby incorporated by reference herein in their entirety.

BACKGROUND OF THE INVENTION

Field of the Invention

The present invention relates to an information providing technique related to a transportable power supply device.

Description of the Related Art

Techniques for collecting and managing information on apparatuses using a communication network have been proposed. For example, Japanese Patent Laid-Open No. 2002-304487 discloses a system that collects information on an apparatus via a communication network and performs its maintenance and management or the like.

Transportable power supply devices typified by portable generators and portable batteries are widely used as power sources for electric power apparatuses for leisure and business at places they are brought to. New demand can occur at places where transportable power supply devices are brought and used. For example, when a transportable power supply device is used in the suburbs, it may be used as a power source for a cooking device used for barbecues or the like, and demand for foodstuff can occur. Service providers who provide foodstuff or the like can expand business opportunities if they can know there is such demand. If foodstuff or the like can be procured locally, convenience of users of transportable power supply devices will be also improved. Since transportable power supply devices are taken out to unspecified places, however, it is difficult for service providers to know such demand.

SUMMARY OF THE INVENTION

An object of the present invention is to provide service providers with beneficial information regarding demand associated with use of transportable power supply devices.

According to an aspect of the present invention, provided is an information providing device comprising: a reception unit configured to receive current location information on a transportable power supply device from the transportable power supply device that supplies power to an electric apparatus detachably connected thereto; an information generation unit configured to generate use place information indicating a place of use of the transportable power supply device based on the received current location information; and a transmission unit configured to transmit the use place information to a service provider's terminal, wherein the reception unit receives information on the electric apparatus connected to the transportable power supply device from the transportable power supply device, and the use place information includes information on a type of the electric apparatus connected to the transportable power supply device.

Further features of the present invention will become apparent from the following description of exemplary embodiments (with reference to the attached drawings).

DESCRIPTION OF THE EMBODIMENTS

Hereinafter, embodiments will be described in detail with reference to the attached drawings. Note that the following embodiments are not intended to limit the scope of the claimed invention, and limitation is not made an invention that requires all combinations of features described in the embodiments. Two or more of the multiple features described in the embodiments may be combined as appropriate. Furthermore, the same reference numerals are given to the same or similar configurations, and redundant description thereof is omitted.

<System Configuration>

Figure 1:
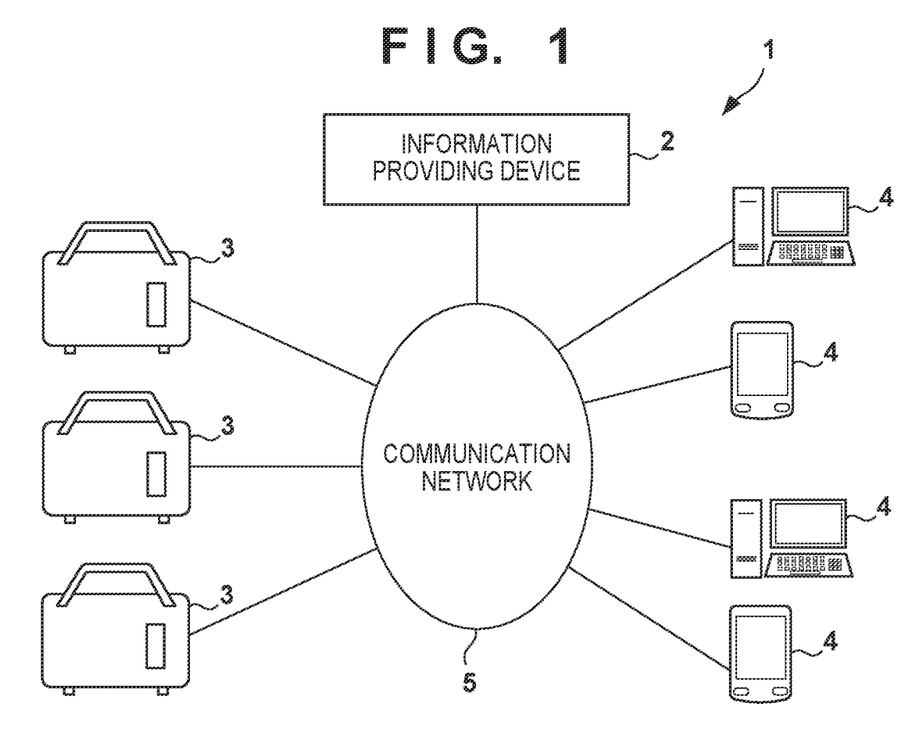
FIG. 1 is a schematic diagram of an information providing system.

FIG. 1 is a schematic diagram of an information providing system 1. The information providing system 1 includes an information providing device 2, a plurality of transportable power supply devices 3, and a plurality of terminals 4 that are communicatively connected via a communication network 5. Although three transportable power supply devices 3 are illustrated in the shown example, a large number of transportable power supply devices 3 can be included in the system 1. Similarly, although four terminals 4 are illustrated in the shown example, a large number of terminals 4 can be included in the system 1.

The information providing device 2 is a computer that functions as an information providing server in the information providing system 1. Each of the transportable power supply devices (hereinafter, also simply referred to as power supply devices) 3 is a device that supplies power to an electric apparatus, and is a transportable device but not a stationary device. Therefore, the transportable power supply device would be able to be transported to a place of use according to a user's use such as leisure, business, or emergency. The power supply device 3 may be an object owned or rented by the user.

Each of the terminals 4 is a computer used by a service provider, and is, for example, a PC or a mobile terminal. The terminal 4 includes a display device and a communication device. The service provider is a trader who provides products or services for a user of the power supply device 3. Each terminal 4 is assumed to be used by a different trader.

In the information providing system 1, the information providing device 2 collects information on a place of use of the power supply device 3 from the power supply device 3 via the communication network 5 such as the Internet, and provides the collected information for the terminal 4. The service provider understands the place of use of the power supply device 3 based on the provided information. That is, the provided information can be used to provide services at the place of use. An operator of the information providing device 2 may provide information in exchange for price from the service provider. The user of the power supply device 3 may be given some incentive in exchange for allowing use of the information on the place of use. For example, a discount on a maintenance cost of the power supply device 3 can be mentioned. When the power supply device 3 is rental, a discount on a rental fee can be mentioned.

<Transportable Power Supply Device>

Figure 2:
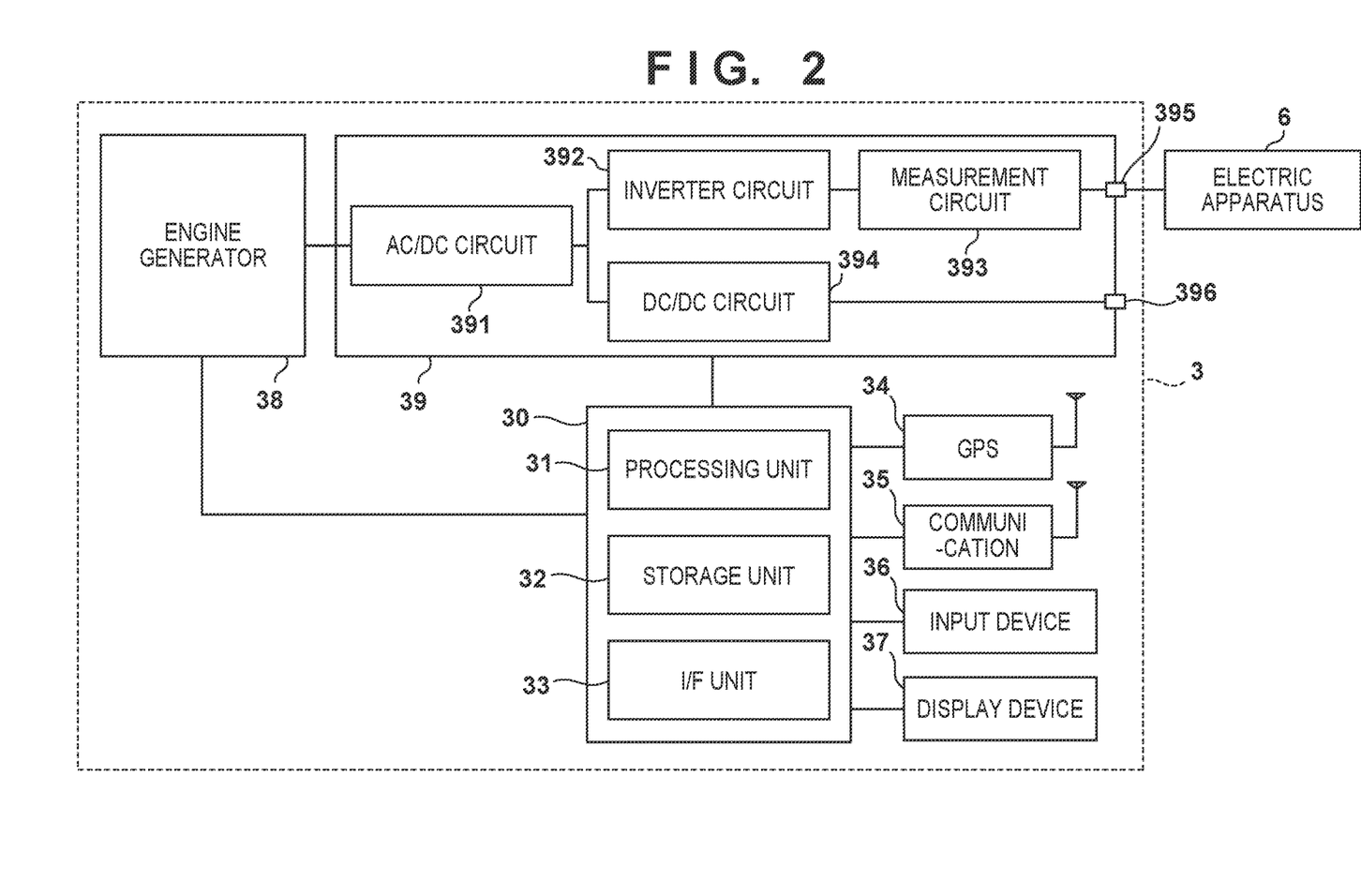
FIG. 2 is a block diagram of a transportable power supply device according to one embodiment of the present invention.

FIG. 2 is a block diagram of the power supply device 3. The power supply device 3 of the embodiment is a generator-type power supply device including an engine generator 38. The engine generator 38 of the embodiment generates AC power driven by fuel. The fuel is, for example, gasoline, liquefied petroleum gas, or hydrogen.

A power supply circuit 39 is a circuit that converts voltage generated by the engine generator 38 into predetermined AC and DC. An AC/DC circuit 391 includes a rectifying/smoothing circuit or the like that rectifies and smooths AC generated by the engine generator 38. An inverter circuit 392 is a circuit that converts DC output from the AC/DC circuit 391 into stable AC having a predetermined frequency.

A measurement circuit 393 includes a current sensor and a voltage sensor, measures AC voltage and AC current supplied from the inverter circuit 392 to an electric apparatus 6 connected to an AC outlet 395, and outputs measurement results to a control circuit 30. The electric apparatus 6 that can be driven by AC power is detachably connected to the AC outlet 395. As the electric apparatus 6, when the power supply device 3 is used for leisure, a cooker, an air conditioner, a television, a lighting fixture, a dryer, or the like can be mentioned. As the cooker, a hot plate, a kettle, a microwave oven, a grill, a mixer, or the like can be mentioned. When the power supply device 3 is used for business, a power tool, a large lighting device, a compressor, or the like can be mentioned.

A DC/DC circuit 394 converts a level of DC voltage output from the AC/DC circuit 391, supplies an operation voltage to the control circuit 30 or the like, and outputs from a DC outlet 396. The electric apparatus 6 that can be driven by DC power is detachably connected to the DC outlet 396.

The control circuit 30 is a circuit that controls the power supply device 3. The control circuit 30 includes a processing unit 31, a storage unit 32, and an I/F (interface) unit 33. The processing unit 31 is a processor typified by a CPU, and executes a program stored in the storage unit 32. The storage unit 32 is a storage device such as a RAM, a ROM, or a hard disk. The storage unit 32 stores various types of data in addition to the program executed by the processing unit 31.

The I/F unit 33 relays transmission and reception of signals between an external device and the processing unit 31.

A GPS sensor 34 detects a current location of the power supply device 3. A communication device 35 is a wireless communication device that performs information communication with the information providing device 2 via the communication network 5. An input device 36 is a device that receives an operation input of the user of the power supply device 3, and is, for example, a plurality of switches. A display device 37 is a device that displays information to the user of the power supply device 3, and is, for example, an image display device, such as a liquid crystal display device, or a light-emitting element, such as an LED.

The processing unit 31 can transmit information on the current location detected by the GPS sensor 34 and the measurement results of the measurement circuit 393 to the information providing device 2 by the communication device 35. The measurement results of the measurement circuit 393 can be also used as information related to a type of the electric apparatus 6 connected to the AC outlet 395 of the power supply device 3, and in particular, can be used for estimating the type. The power supplied to the electric apparatus 6 shows a waveform characterized by the type of the electric apparatus 6. The type of the connected electric apparatus 6 can be estimated from its feature quantity.

The feature quantity is, for example, apparent power and power factor. The power factor is found by dividing effective power by the apparent power, or is found as a cosine (cos θ) of a phase difference between voltage and current. In the latter case, the measurement circuit 393 measures the phase difference θ. Furthermore, the feature quantity may include a time from start of the electric apparatus 6 to stable operation, or a peak value of start current flowing through the electric apparatus 6 when the electric apparatus 6 starts. By converting a relationship between the type of the electric apparatus 6 and the feature quantity into data in advance as a feature quantity map and comparing the feature quantity map with a feature quantity measured with the measurement circuit 393, the type of the electric apparatus 6 can be estimated.

<Information Providing Device>

Figure 3:
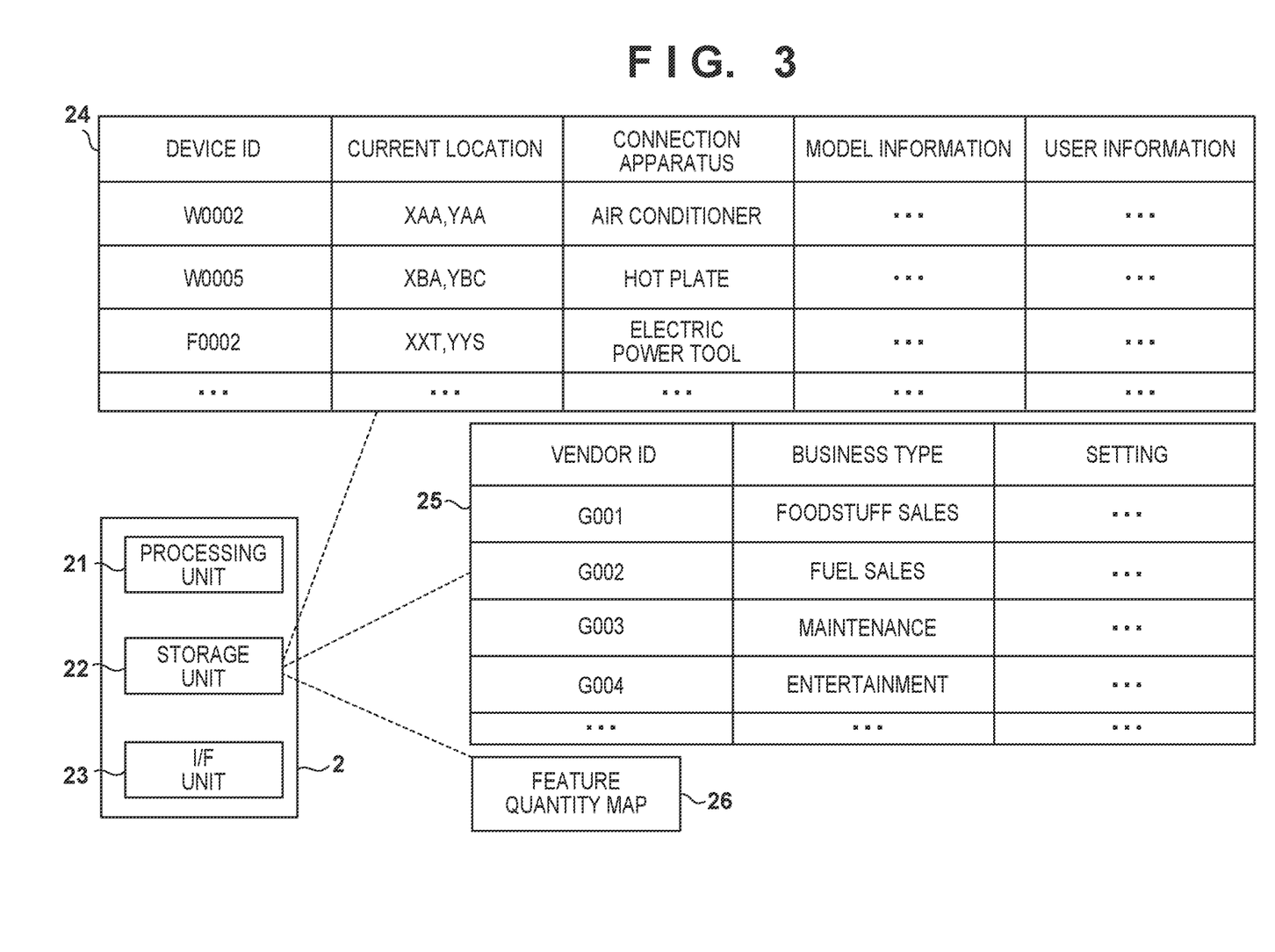
FIG. 3 is a block diagram of an information providing device according to one embodiment of the present invention.

FIG. 3 is a block diagram of the information providing device 2. The information providing device 2 includes a processing unit 21, a storage unit 22, and an I/F (interface) unit 23. The processing unit 21 is a processor typified by a CPU, and executes a program stored in the storage unit 22. The I/F unit 23 relays transmission and reception of signals between an external device and the processing unit 21. The I/F unit 23 includes a wired or wireless communication interface capable of communicating with the power supply devices 3 and the terminals 4 via the communication network 5. The storage unit 22 is a storage device such as a RAM, a ROM, or a hard disk.

The storage unit 22 stores various types of data in addition to the program executed by the processing unit 21. In the example of FIG. 3, databases 24 to 26 are illustrated as data stored in the storage unit 22. The database 24 is a database that has accumulated data on the power supply devices 3. "Device ID" is an identifier assigned to identify the individual power supply device 3. In the case of the embodiment, the identifier is assigned in advance to the power supply device 3. However, it is possible to assign the identifier during communication. "Current location" is the current location information on the power supply device 3. The information is a detection result of the GPS sensor 34 transmitted from the power supply device 3, and is, for example, coordinate information.

"Connection apparatus" is information indicating the type of the electric apparatus 6 currently connected to the power supply device 3. In the case of the embodiment, the database 26 is a database that has accumulated a feature quantity map. The processing unit 21 collates the information (here, the measurement results of the measurement circuit 393) related to the type of the electric apparatus 6 transmitted from the power supply device 3 with the feature quantity map, estimates the electric apparatus 6 currently connected to the power supply device 3, and accumulates an estimation result as the "connection apparatus." The information related to the type of the electric apparatus 6 transmitted from the power supply device 3 may be the measurement results of the measurement circuit 393 themselves, or may be the feature quantity calculated on the power supply device 3 side. In the embodiment, the information providing device 2 side estimates the type of the electric apparatus 6, but the power supply device 3 side may estimate it and transmit an estimation result as the information related to the type of the electric apparatus 6 to the information providing device 2.

"Model information" is information on specification of the power supply device 3. It is information such as a drive system, rated output, and a continuous operation available time in one full refueling. "User information" is information on the power supply device 3. The information can include contact information on the user, specification history of the power supply device 3, and incentive information given to the user.

The database 25 is a database that has accumulated registration information on the service provider. In the embodiment, it is assumed that the service provider preregisters as a premise for receiving information from the information providing device 2. "Trader ID" is an identifier that identifies each service provider.

"Business type" is information that identifies a type of business of the service provider. The shown example illustrates foodstuff sales, fuel sales, maintenance, and entertainment. The foodstuff sales is the type of business that sells food products such as meat, vegetables, or drinks. The fuel sales is the type of business that sells fuel usable for the engine generator 38 or the like. The maintenance is the type of business that undertakes repairs and adjustments of the power supply device 3. The entertainment is the type of business that provides performances such as street performance, magic tricks, and singing, and is, for example, the type of business that dispatches performers who enliven the venue when the power supply device 3 is used for a leisure purpose.

"Setting" includes a condition of information provided from the information providing device 2. The condition can include, for example, a geographical range (for example, only Tokyo Prefecture, and around XX Coast) of the place of use of the power supply device 3 whose information is provided, a range of the type of the electric apparatus 6 connected to the power supply device 3, or the specification (such as rated output and fuel consumption) of the power supply device 3.

<Process Example>

Figure 4:
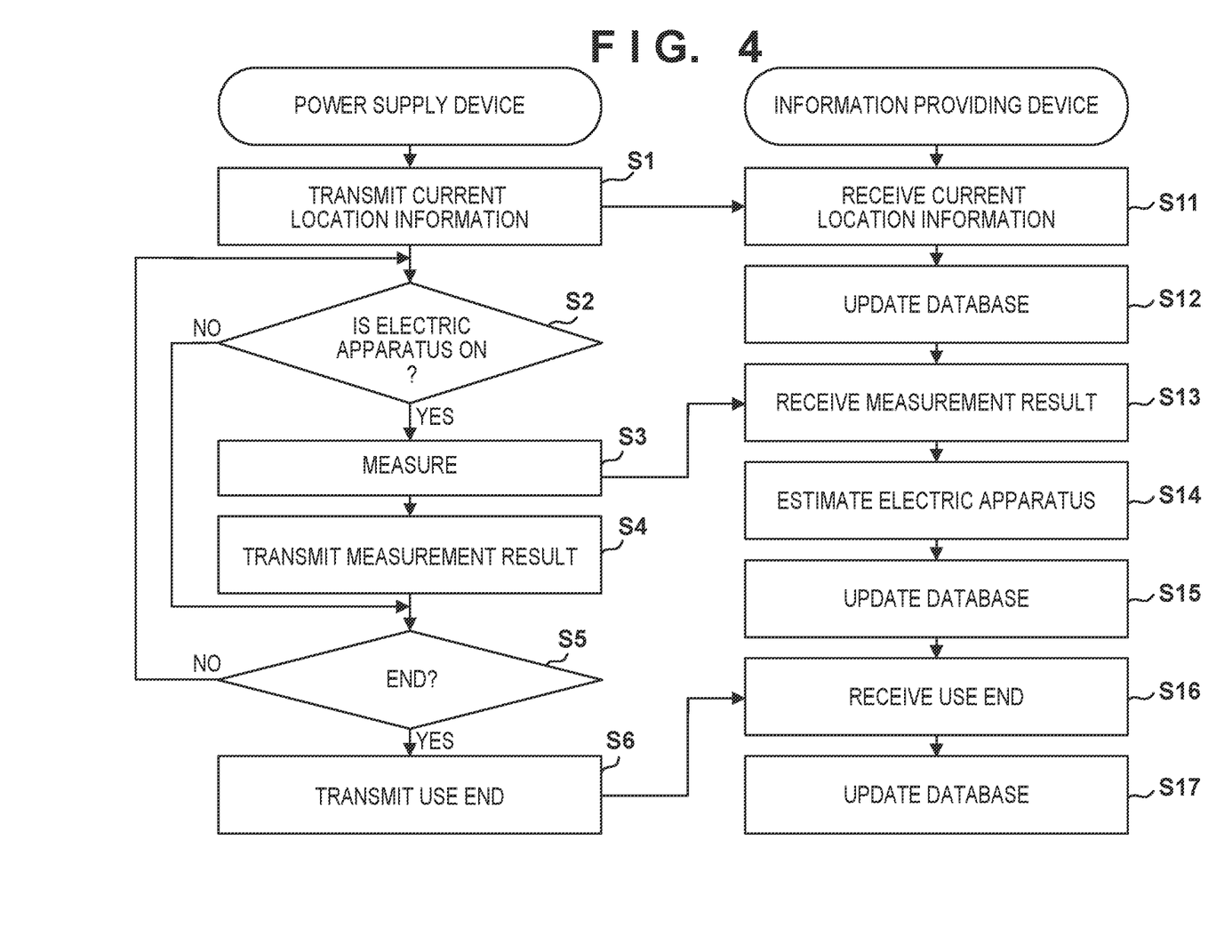
FIG. 4 is a flowchart showing a process example of the system of FIG. 1.

A process example of the information providing system 1 will be described. FIG. 4 shows a process example between the information providing device 2 and the power supply device 3, and shows a process example in which the information providing device 2 collects the information on the power supply device 3. In the information providing device 2, the processing unit 21 performs the process, and in the power supply device 3, the processing unit 31 performs the process. When the power supply device 3 starts, a process of S1 is performed. The power supply device 3 starts when the engine generator 38 starts and generates power. The engine generator 38 starts by, for example, the user's start operation.

In S1, the power supply device 3 acquires the detection result of the GPS sensor 34, and transmits current location information thereof together with the device ID of the power supply device 3 to the information providing device 2. The information providing device 2 receives the current location information in S11, updates the database 24 in S12, and records the received current location information in the "current location" of the power supply device 3

The power supply device 3 determines whether the electric apparatus 6 connected to an AC outlet 395 is turned on. This determination can be made based on whether power is supplied to the electric apparatus 6 based on the measurement results of the measurement circuit 393. When it is determined that the electric apparatus 6 is on, the process proceeds to S4, and when it is determined that the electric apparatus 6 is off, the process proceeds to S6.

The power supply device 3 measures power it supplies with the measurement circuit 393 in S4, and stores measurement results in the storage unit 32. In subsequent S5, the measurement results stored in the storage unit 32 is transmitted as the information on the type of the electric apparatus 6 together with the device ID. The information providing device 2 receives the measurement results in S13. In subsequent S14, the information providing device 2 calculates a feature quantity from the received measurement results, collates the calculated feature quantity with the feature quantity map in the database 26, and estimates the type of the electric apparatus 6. In S15, the database 24 is updated, and the estimated type of the electric apparatus 6 is recorded in the "connection apparatus."

The power supply device 3 determines whether the user has performed an end operation of power generation in S6. The end operation can be received by, for example, the input device 36. In subsequent S7, the power supply device 3 transmits information indicating use end together with the device ID to the information providing device 2, and then stops the engine generator 38. The information providing device 2 receives information indicating the use end in S16. In subsequent S17, the database 24 is updated, and the end of use is recorded in a record of the power supply device 3.

Figure 5:
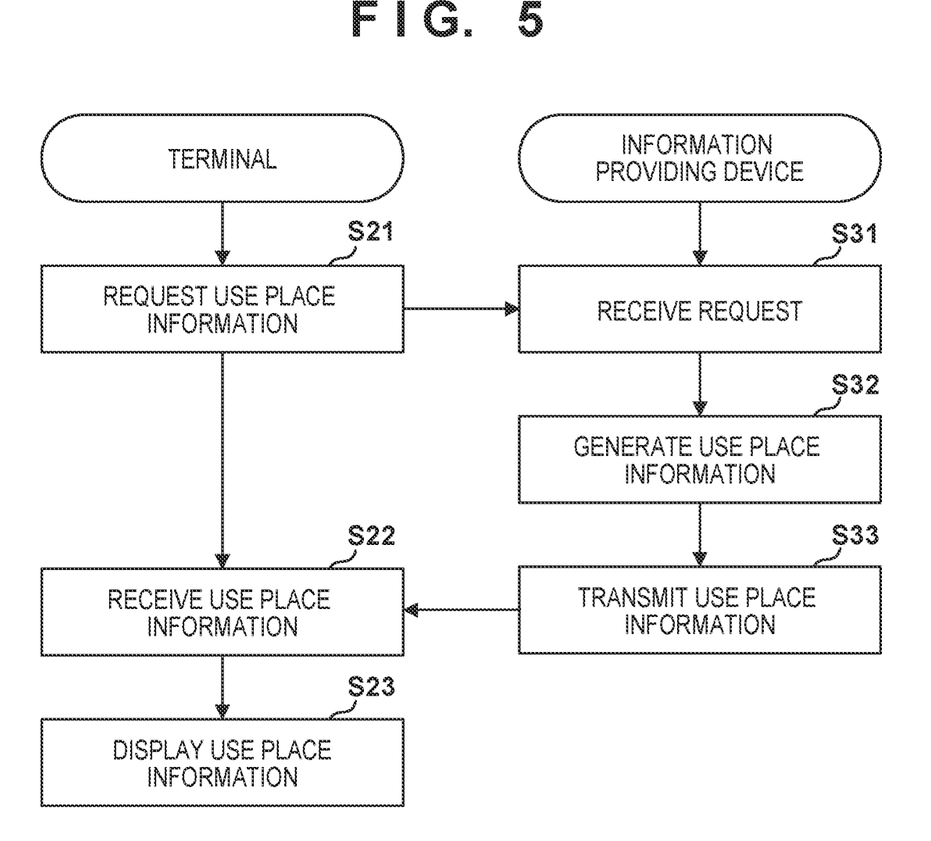
FIG. 5 is a flowchart showing a process example of the system of FIG. 1.

Next, FIG. 5 shows a process example between the information providing device 2 and the terminal 4, and shows a process example in which the information providing device 2 provides the terminal 4 with information. In the information providing device 2, the processing unit 21 performs the process, and in the terminal 4, its processing unit (CPU or the like) performs the process.

The terminal 4 transmits a request for use place information together with the trader ID to the information providing device 2 in S21. The information providing device 2 receives the request in S31, and generates the use place information in S32. The use place information is generated by referring to the database 24 and obtaining the current location information on the power supply device 3. In subsequent S33, the information providing device 2 transmits the use place information generated in S32 to the terminal 4 that has made the request. The terminal 4 receives the use place information in S22, and displays the received use place information on the display device in S23. The service provider, who is the user of the terminal 4, can obtain beneficial information regarding demand associated with the use of the power supply device 3.

The use place information may be a list of the current locations of the power supply devices 3. However, if the list enumerates characters, it may be difficult for the service provider to visually understand the places of use of the power supply devices 3. Therefore, the information providing device 2 may generate distribution information on a map on the power supply devices 3 as the use place information in S32.

Figure 6:
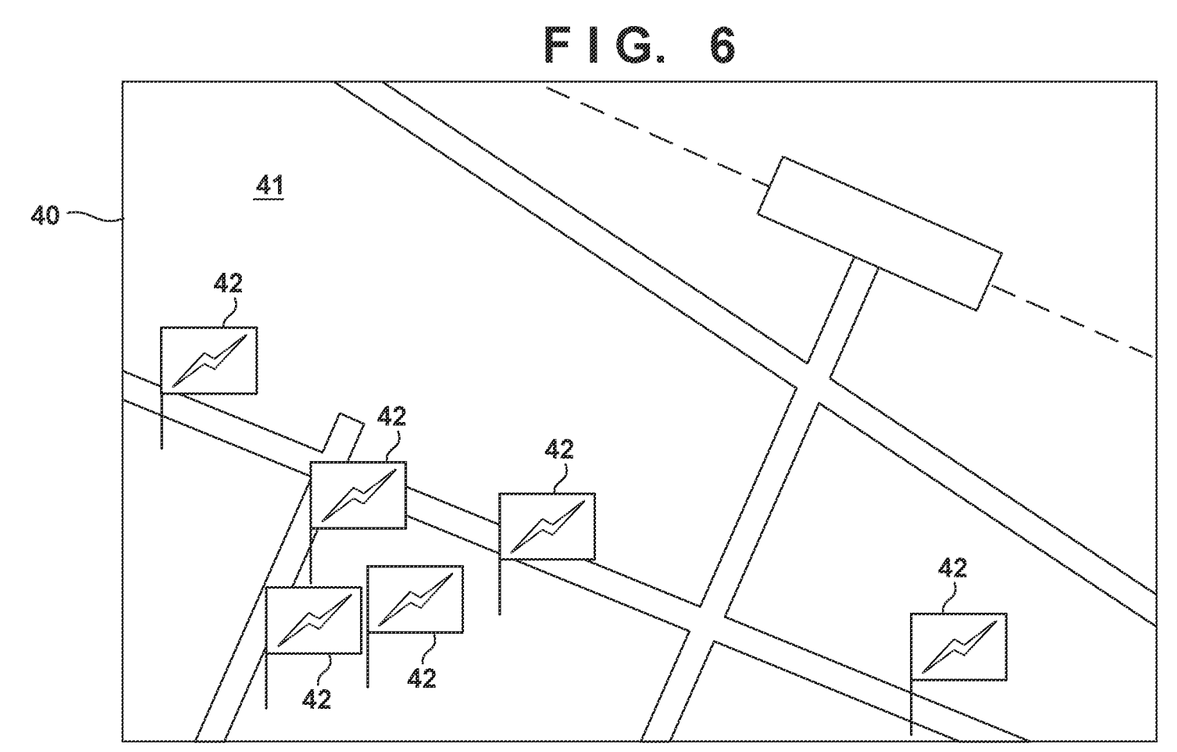
FIG. 6 is a diagram showing a display example of use place information.

FIG. 6 is an example of the distribution information, and illustrates a display example 40 displayed on the display device of the terminal 4 in S23. The display example 40 includes a map image 41 and marks 42 indicating the current locations of the power supply devices 3. In the case of the example of the figure, the marks 42 have a flag shape and are set up at the respective places of use of the power supply devices 3. Such a display example 40 makes it easy for the service provider to visually recognize the places of use of the power supply devices 3. In generating the use place information for such a display example 40, the information providing device 2 may accumulate map data that is a source of the map image 41 in the storage unit 22, or may acquire it from a providing server of the map data via the communication network 5. An area included in the map image 41 may be defined based on a condition accumulated in the "setting" of the database 25.

Figure 7:
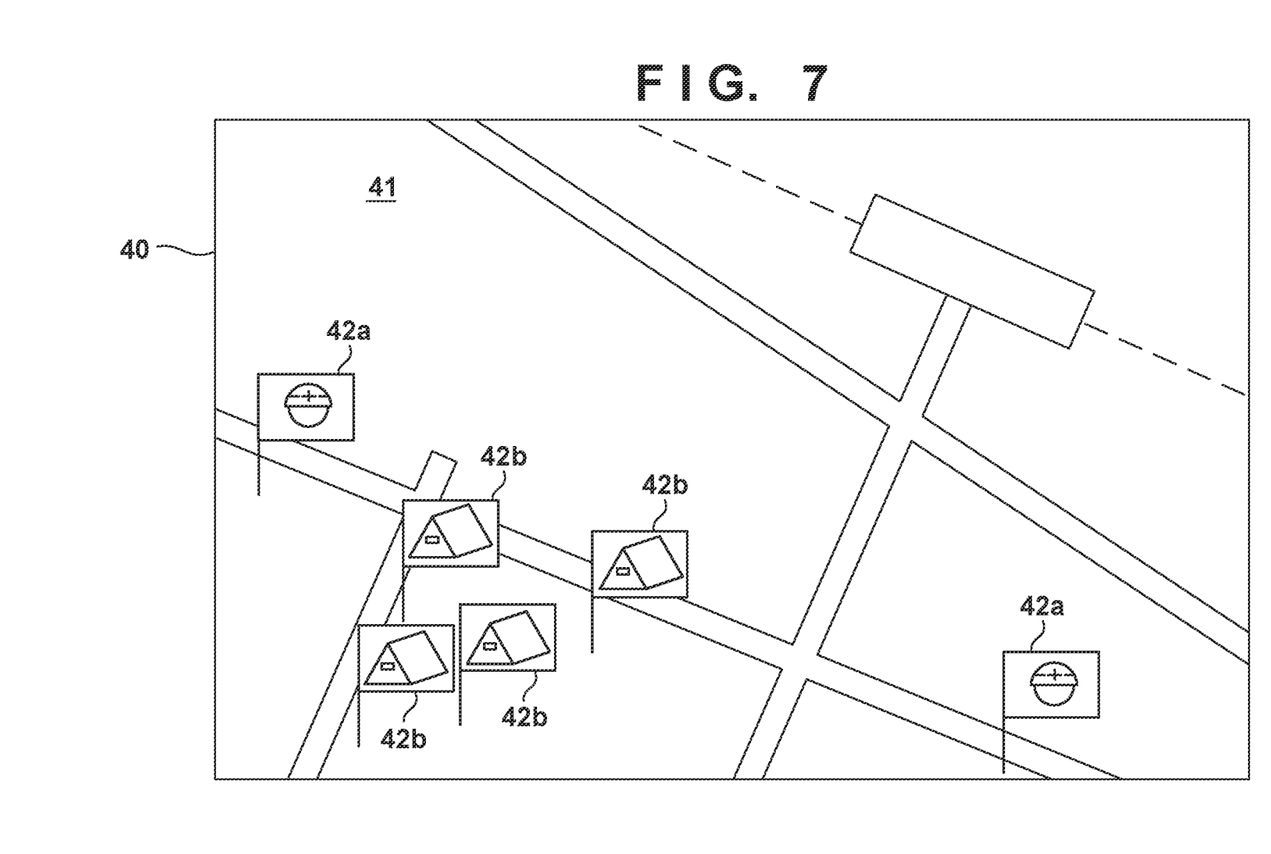
FIG. 7 is a diagram showing a display example of the use place information.

FIG. 7 is another example of the distribution information, and illustrates a display example 40 displayed on the display device of the terminal 4 in S23. In the example of the figure, marks 42a and 42b corresponding to the marks 42 in FIG. 6 include information on the types of the electric apparatuses 6 connected to the power supply devices 3.

The mark 42a displays an icon of the face of a person wearing a helmet, and indicates that the power supply device 3 is used at a work site or a construction site. The icon is associated with the type of the electric apparatus 6, such as an electric tool, a large lighting device, or a compressor, that has a strong tendency to be used for a business use. On the other hand, the mark 42b displays an icon of a tent, and indicates that the power supply device 3 is used for the leisure purpose. The icon is associated with the type of the electric apparatus 6, such as a cooker, an air conditioner, or a television, that has a strong tendency to be used for a leisure use.

The display example 40 of FIG. 7 is not only easy for the service provider to visually recognize the places of use of the power supply devices 3, but also makes it easy to recognize the types of the connected electric apparatuses 6, and so makes it easy to select a business location beneficial to them. In generating the use place information for such a display example 40, the information providing device 2 can store a table that predefines a relation between the icon and the electric apparatus 6 in the storage unit 22, refer to the table and the "connection apparatus" in the database 24, and select the icon to be displayed. Although there are two types of icons in the example of FIG. 7, it goes without saying there may be three or more types, and increasing types makes it easy for the service provider to select a business location beneficial to them.

Figure 8:
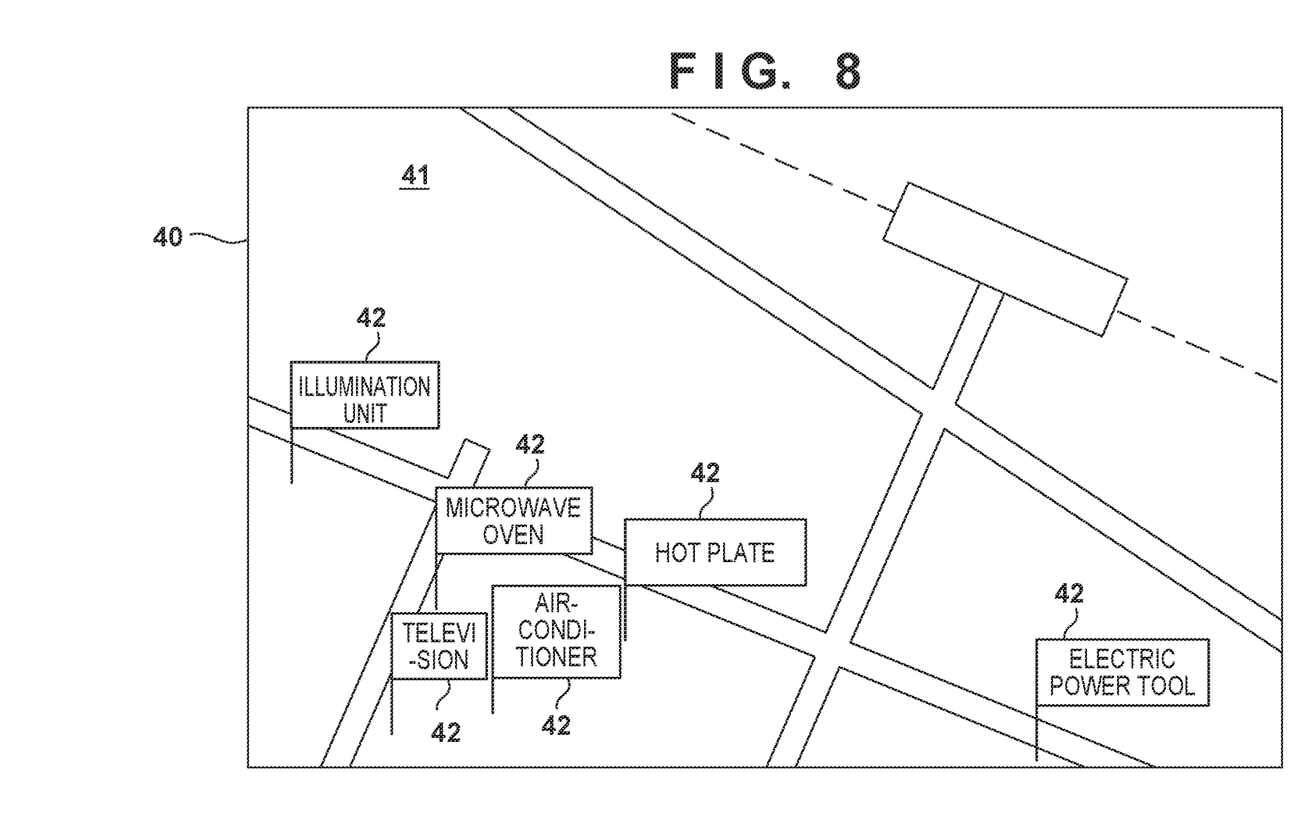
FIG. 8 is a diagram showing a display example of the use place information.

FIG. 8 is still another example of the distribution information, and illustrates a display example 40 displayed on the display device of the terminal 4 in S23. In the example of the figure, each mark 42 includes the information on the type of the electric apparatus 6 connected to the power supply device 3. The example of FIG. 8 displays the types of the electric apparatuses 6 with characters. The display example 40 of FIG. 8 is not only easy for the service provider to visually recognize the places of use of the power supply devices 3, but also makes it easy to more directly recognize the types of the connected electric apparatuses 6, and so makes it easy to select a business location beneficial to them. The example of FIG. 8 displays the types of the electric apparatuses 6 with characters, but icons imitating the electric apparatuses 6 may be used.

When generating the use place information for such a display example 40, the information providing device 2 can refer to the "connection apparatus" in the database 24, and determine characters to be displayed. Although the example of FIG. 8 displays the characters indicating the lowest concept of the electric apparatuses 6, they may be characters indicating a middle concept. For example, a hot plate may be displayed as a cooker.

Figure 9:
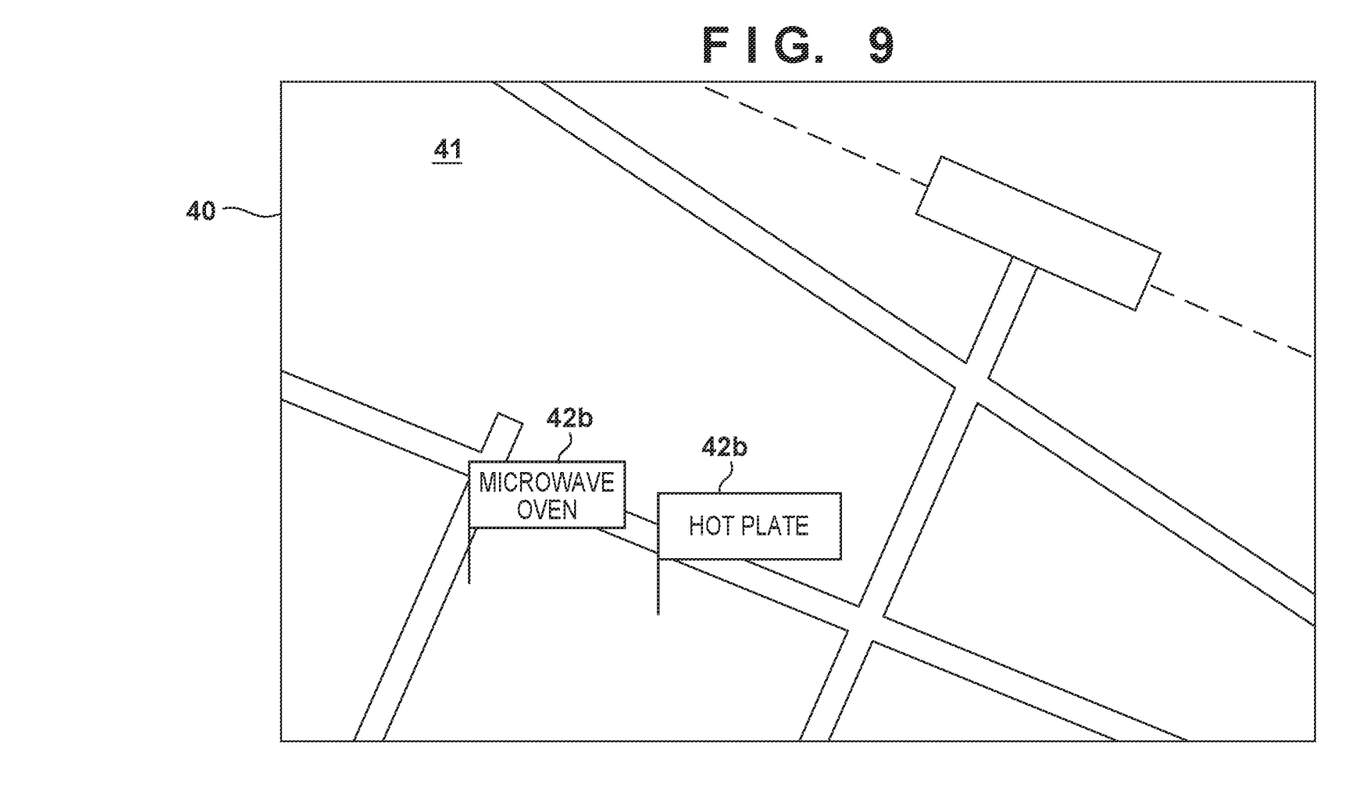
FIG. 9 is a diagram showing a display example of the use place information.

FIG. 9 is still another example of the distribution information, and illustrates a display example 40 displayed on the display device of the terminal 4 in S23. In the example of the figure, the places of use of all the power supply devices 3 used in the area of the map image 41 are not displayed and part of the power supply devices 3 are selected and their places of use are shown. Selection of the power supply devices 3 that are a target of the use place information can be made based on the registration information on the service provider who has requested the use place information, in particular, the "business type" or the "setting."

For example, when the "business type" is sales of foodstuff, selection of the power supply device 3 connected to the cooker as the electric apparatus 6 is beneficial to the service provider. When a condition that the power supply device 3 for the leisure purpose is a target is set in the "setting," selection of the power supply devices 3 connected to the cooker, the air conditioner, the television, and the like as the electric apparatus 6 is beneficial to the service provider. In the example of FIG. 9, it is assumed that a service provider whose "business type" is sales of foodstuff requests the use place information, and the example of FIG. 8 shows an example of the use place information in which the target is narrowed down to the power supply device 3 connected to the cooker. The service provider can recognize the business location beneficial to them at a glance.

When generating the use place information for such a display example 40, the information providing device 2 can refer to the "connection apparatus" in the database 24 and the "business type" or the "setting" in the database 25, and select the power supply device 3 that is the target of the use place information.

Other Embodiments

<Other Information Providing Process Example>

Figure 10:
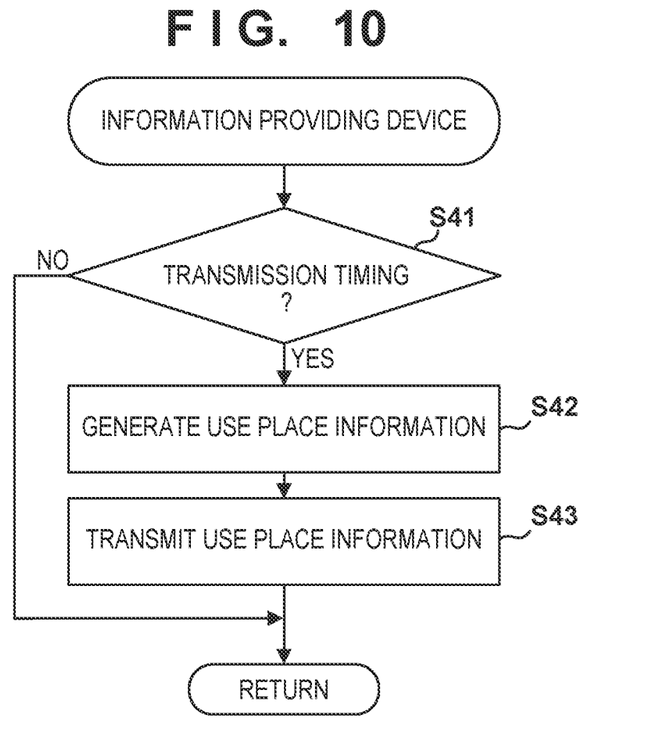
FIG. 10 is a flowchart showing another process example of the information providing device of FIG. 3.

Although in the embodiment described above, the information providing device 2 generates the use place information triggered by the request from the terminal 4 and transmits it to the terminal 4, methods are not limited to this. For example, the information providing device 2 may generate the use place information at a predetermined timing and transmit it to the terminal 4. The timing can be designated in advance by the service provider by, for example, day, hour, or cycle, and this condition can be stored in the "setting" of the database 25. The information providing device 2 refers to the "setting" of the database 25, generates the use place information when the designated timing comes, and sends the use place information to the terminal 4 by email or the like. In the case of email, a transmission destination address can be stored in the "setting" of the database 25. FIG. 10 is a flowchart showing an example thereof, and the processing unit 21 of the information providing device 2 performs it.

In S41, the "setting" of the database 25 is referred to and it is determined whether a transmission timing has arrived. When the transmission timing has arrived, the process proceeds to S42, and when the transmission timing has not arrived, the process ends. In S42, the use place information is generated. It is the same process as that of S32 of FIG. 5. In S43, the use place information generated in S42 is transmitted to the terminal 4. This ends the processes.

<Other Configuration Example of Power Supply Device>

Figure 11:
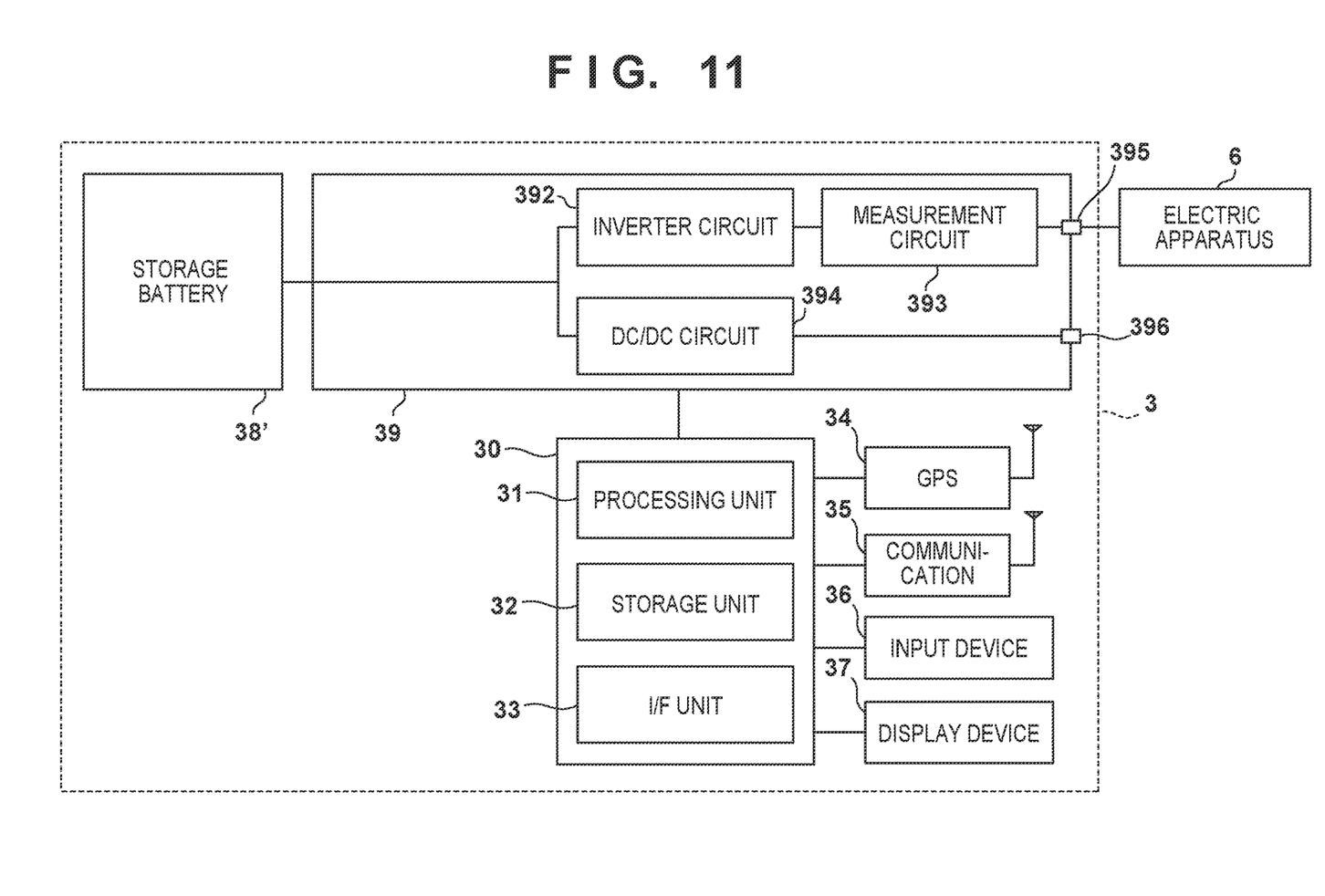
FIG. 11 is a block diagram of another transportable power supply device.

The power supply device 3 illustrated in FIG. 2 includes the engine generator 38, but the configuration is not limited to this. FIG. 11 shows a power supply device 3 employing a storage battery 38' instead of the engine generator 38. Description of parts common to the example of FIG. 2 will be omitted. The storage battery 38', for example, outputs a DC voltage such as 48 V to an inverter circuit 392 or a DC/DC circuit 394.

Figure 12:
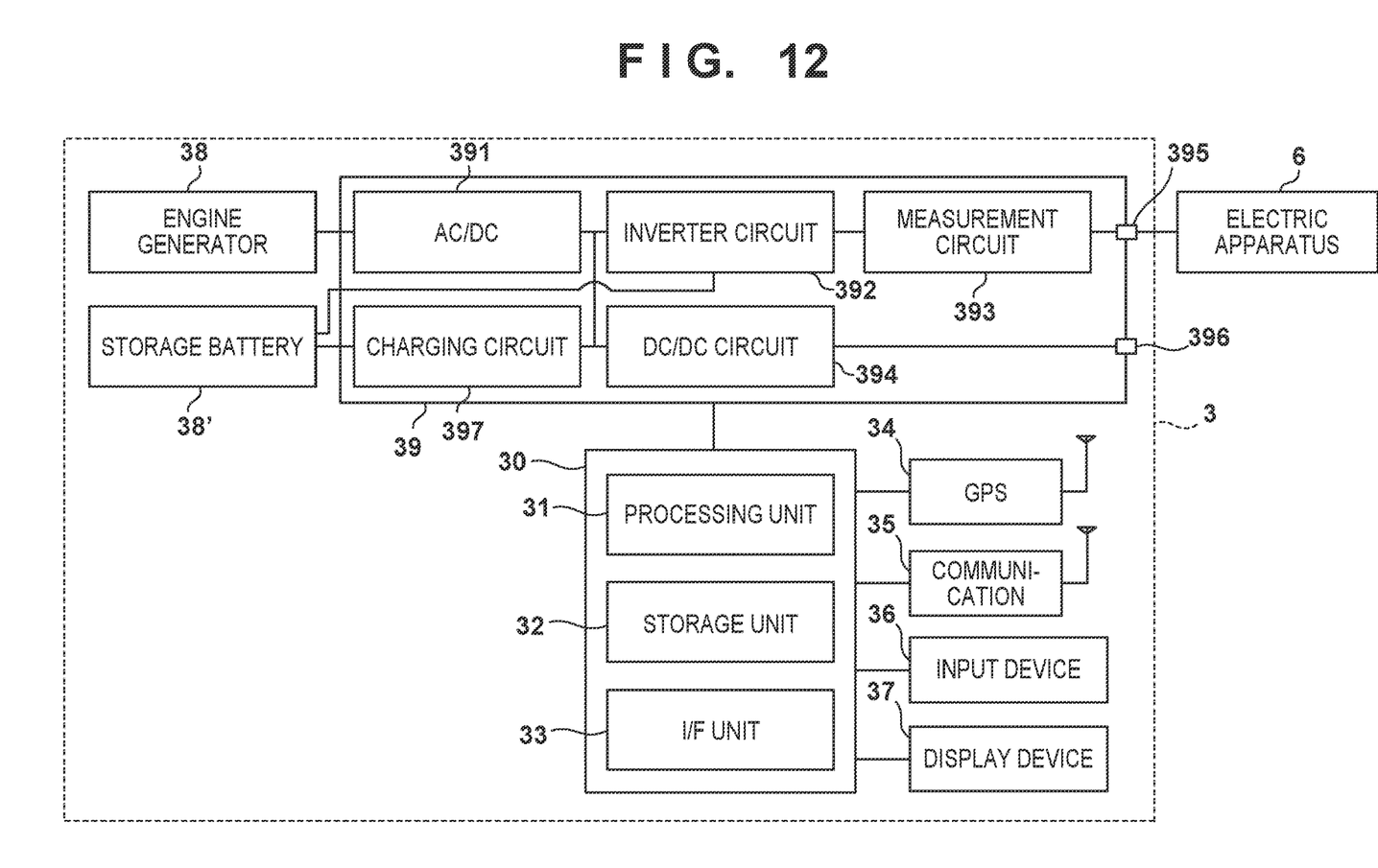
FIG. 12 is a block diagram of another transportable power supply device.

FIG. 12 shows a power supply device 3 including both the engine generator 38 and the storage battery 38'. Description of parts common to the example of FIG. 2 or 11 will be omitted. The inverter circuit 392 converts DC generated by an AC/DC circuit 391 or DC supplied from the storage battery 38' into AC. A charging circuit 397 charges the storage battery 38' based on power generated by the engine generator 38. The power supply device 3 shown in FIG. 12 can supply power stored in the storage battery 38' to an electric apparatus 6 even after fuel of the engine generator 38 runs out.

<Summary of Embodiments>

1. An information providing device (for example, 2) of the embodiment comprises:

a reception unit (for example, 21, 23, and S11) configured to receive current location information on a transportable power supply device (for example, 3) from the transportable power supply device that supplies power to an electric apparatus (for example, 6) detachably connected thereto;

an information generation unit (for example, 21, S32, and S42) configured to generate use place information (for example, 40) indicating a place of use of the transportable power supply device based on the received current location information; and a transmission unit (for example, 21, 23, S33, and S43) configured to transmit the use place information to a service provider's terminal (for example, 4).

According to this embodiment, it is possible to provide the service provider with beneficial information regarding demand associated with use of the transportable power supply device.

2. In the embodiment, the information generation unit generates distribution information on a map on the transportable power supply device as the use place information.

According to the embodiment, it is possible to provide the service provider with information that is easy to visually recognize the place of use of the transportable power supply device.

3. In the embodiment, the reception unit receives information on the electric apparatus connected to the transportable power supply device from the transportable power supply device, and the use place information includes information on a type of the electric apparatus connected to the transportable power supply device (for example, FIGS. 7 and 8).

According to the embodiment, it is possible to provide the service provider with information that is not only easy for the service provider to visually recognize the place of use of the transportable power supply device, but also easy to select the place of use where an electric apparatus suitable for their type of business is used.

4. In the embodiment, the reception unit receives the current location information and information on the electric apparatus connected to the transportable power supply device from the transportable power supply device, and the information generation unit selects the transportable power supply device to be a target of the use place information transmitted to the service provider's terminal based on registration information (for example, 25) on the service provider and the type of the electric apparatus identified from the information on the electric apparatus (for example, FIG. 9).

According to the embodiment, it is possible to provide the service provider with information that is not only easy for the service provider to visually recognize the place of use of the transportable power supply device, but also on the place of use where an electric apparatus suitable for their type of business is used.

5. In the embodiment, the registration information includes information on a business type of the service provider.

According to the embodiment, it is possible to provide the service provider with information on the place of use where the electric apparatus suitable for the business type of the service provider is used.

6. In the embodiment, the information generation unit at least selects the transportable power supply device connected to a cooker as the transportable power supply device to be a target of the use place information when the business type of the service provider is sales of foodstuff (for example, FIG. 9).

According to the embodiment, it is possible to provide beneficial information to the service provider who sells foodstuff.

7. An information providing method of the embodiment comprises:

a reception step (for example, S11) of receiving, by a server (for example, 2), current location information on a transportable power supply device (for example, 3) from the transportable power supply device that supplies power to an electric apparatus (for example, 6) detachably connected thereto;

an information generation step (for example, S32 and S42) of generating, by the server, use place information indicating a place of use of the transportable power supply device based on the received current location information; and a transmission step (for example, S33 and S43) of transmitting, by the server, the use place information to a service provider's terminal (for example, 4).

According to this embodiment, it is possible to provide the service provider with beneficial information regarding demand associated with use of the transportable power supply device.

8. A transportable power supply device (for example, 3) of the embodiment is a transportable power supply device to which an electric apparatus (for example, 6) is detachably connected and which supplies power to the electric apparatus, and comprises:

a detection unit (for example, 34) configured to detect a current location of the transportable power supply device; and a transmission unit (for example, 31, 35, S1, and S4) configured to transmit, to a server (for example, 2), information on the detected current location and information on a type of the electric apparatus to which power is supplied.

According to this embodiment, it is possible to provide the transportable power supply device that contributes to providing the service provider with beneficial information regarding demand associated with use of the transportable power supply device.

9. The transportable power supply device of the embodiment further comprises a measurement unit (for example, 393) configured to measure voltage and current supplied to the electric apparatus, wherein the information on the type of the electric apparatus is information based on measurement results of the measurement unit.

According to the embodiment, it is possible to provide the server with information for estimating the type of the connected electric apparatus.

10. The transportable power supply device of the embodiment further comprises a power generation unit (for example, 38) and/or a power storage unit (for example, 38').

According to the embodiment, it is possible to provide the connected electric apparatus with power by the power generation unit or the power storage unit.

The invention is not limited to the foregoing embodiments, and various variations/changes are possible within the spirit of the invention.

What is claimed is:

1. A system comprising:

an information providing device, and transportable power supply devices, to each of which an electric apparatus is detachably connected, and each of which supplies power to the electric apparatus, wherein each transportable power supply device comprises:

a first sensor configured to detect a current location of an associated transportable power supply device;

second sensors configured to measure voltage and current supplied to the electric apparatus; and a first electronic circuit including a first processor, a first storage device and a first communication interface, the first electronic circuit being configured to transmit, to the information providing device, the current location detected by the first sensor and measurement results of the second sensors, wherein the information providing device comprises:

a second electronic circuit including a second processor, a second storage device and a second communication interface, the second electronic circuit being configured to:

receive the current location detected by the first sensor and the measurement results of the second sensors from a transportable power supply device;

estimate a type of the electric apparatus connected to the transportable power supply device by collating the measurement results of the second sensors with a feature quantity map stored in the second storage device, the feature quantity map indicating a relationship between each type of electric apparatus and a feature quantity of a power supplied to each type of electric apparatus;

generate use place information indicating a place of use of the transportable power supply device based on the current location detected by the first sensor and an estimation result of the type of the electric apparatus connected to the transportable power supply device; and transmit the use place information to a service provider's terminal, wherein the transportable power supply to be a target of the use place information is selected based on the estimation result of the type of the electric apparatus and a business type of a service provider to which the use place information is transmitted, the business type of the service provider being obtained from registration information stored in the second storage device.

2. The system according to claim 1, wherein each transportable power supply device further comprises a power generation unit and/or a power storage unit.

3. The system according to claim 1, wherein each transportable power supply device further comprises an engine generator, wherein the first electronic circuit is configured to:

obtain the current location by the first sensor and transmit the current location to the information providing device when the engine generator starts; and obtain the measurement results of the second sensors and transmit the measurement results when the electric apparatus is turned on.

* * * * *